(12) United States Patent
Xu et al.

(10) Patent No.: US 11,887,899 B2
(45) Date of Patent: Jan. 30, 2024

(54) REPAIRING METHOD FOR MICRO-LED CHIP DEFECTIVE PIXELS (71) Applicant: WUHAN CHINA STAR OPTOELECTRONICS TECHNOLOGY CO., LTD, Hubei (CN)

(72) Inventors: Lei Xu, Hubei (CN); Guowei Zha, Hubei (CN); Li Zhong, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/959,165

(22) PCT Filed: Apr. 30, 2020

(86) PCT No.: PCT/CN2020/088007
§ 371 (c)(1),
(2) Date: Jun. 30, 2020

(87) PCT Pub. No.: WO2021/212540
PCT Pub. Date: Oct. 28, 2021

(65) Prior Publication Data
US 2023/0036183 A1 Feb. 2, 2023

(30) Foreign Application Priority Data
Apr. 20, 2020 (CN) .......................... 202010312409.2

(51) Int. Cl.
*H01L 21/66* (2006.01)
*H01L 33/00* (2010.01)
(Continued)

(52) U.S. Cl.
CPC .......... *H01L 22/22* (2013.01); *H01L 25/0753* (2013.01); *H01L 25/167* (2013.01); *H01L 25/50* (2013.01); *H01L 33/005* (2013.01)

(58) Field of Classification Search
CPC ....... H01L 22/22; H01L 33/005; H01L 33/24; H01L 25/042; H01L 33/0095; H01L 25/0753; H01L 25/50
See application file for complete search history.

(56) References Cited

U.S. PATENT DOCUMENTS 10,643,980 B2 * 5/2020 Hsieh .................. H01L 25/0753
2015/0318328 A1 11/2015 Bibl et al.
(Continued)

FOREIGN PATENT DOCUMENTS

| CN | 105023522 A | 11/2015 |
|---|---|---|
| CN | 108257516 A | 7/2018 |

(Continued)

*Primary Examiner* — Savitri Mulpuri
(74) *Attorney, Agent, or Firm* — PV IP PC; Wei Te Chung; Zhigang Ma (57) ABSTRACT

A repairing method for micro-LED chip defective pixels is disclosed. By providing a main recess and a backup recess in each of sub-pixel areas of a substrate, wherein each of the main recesses is loaded with a main micro-LED chip, when all of the main micro-LED chips are detected for defective pixels, the backup recess in each of the sub-pixel areas where the defective pixel is detected is loaded with a backup micro-LED chip using a fluid mass transfer method, which improves the repair efficiency.

7 Claims, 8 Drawing Sheets

(51) Int. Cl.
*H01L 25/075* (2006.01)
*H01L 25/16* (2023.01)
*H01L 25/00* (2006.01)

(56) References Cited

U.S. PATENT DOCUMENTS

2017/0256522 A1  9/2017  Cok et al.
2017/0278760 A1  9/2017  Chen et al.
2019/0319015 A1* 10/2019  Schuele .............. H01L 25/0753

FOREIGN PATENT DOCUMENTS

| CN | 108682312 A | 10/2018 |
| CN | 109148506 A | 1/2019 |
| CN | 109637957 A | 4/2019 |
| CN | 110034061 A | 7/2019 |
| CN | 110047785 A | 7/2019 |
| CN | 110137128 A | 8/2019 |
| CN | 110634906 A | 12/2019 |
| CN | 111261653 A | 6/2020 |

* cited by examiner

REPAIRING METHOD FOR MICRO-LED CHIP DEFECTIVE PIXELS

FIELD OF INVENTION

The present disclosure relates to the field of display technologies, and more particularly, to a repairing method for micro-LED chip defective pixels.

BACKGROUND OF INVENTION

Micro-light-emitting diode (micro-LED) displays are self-emissive displays which use micro-LED chips as pixels. Due to advantages of high brightness, high luminous efficiency, and low power consumption, the micro-LED displays have gradually become a focus of competition in the international display industry. Many companies in the industry regard the micro-LED displays as the next generation display technology, and begin to aggressively deploy their strategies.

In the manufacturing process of the micro-LED displays, the micro-LED chips are generally transferred to substrates by a mass transfer method, and after the mass transfer is completed, the micro-LED chips are detected for defective pixels. In the prior art, when a defective pixel is detected, the defective pixel is usually repaired by a repairing method of removing the defective pixel and placing a single pixel in a designated position. That is, each defective pixel is removed and a new micro-LED chip is placed at the defective pixel position. However, the repairing method needs to repeatedly remove defective pixels and repeatedly place new micro-LED chips, resulting in an extremely low repair efficiency.

Technical Problems

The present disclosure provides a repairing method for micro-LED chip defective pixels to solve the technical problem of extremely low repair efficiency of the existing repairing method for micro-LED chip defective pixels.

SUMMARY OF INVENTION

Technical Solutions

In the first aspect, the present application provides a repairing method for micro-LED chip defective pixels, comprising steps of:

providing a substrate, wherein a plurality of sub-pixel areas are provided on the substrate, each of the sub-pixel areas is provided with two recesses, and the two recesses are respectively a main recess and a backup recess;

transferring a great number of main micro-LED chips to the substrate by a fluid mass transfer method, so that the main recess in each of the sub-pixel areas is loaded with one of the main micro-LED chips;

detecting all of the main micro-LED chips to find the sub-pixel area with a defective pixel; and transferring a plurality of backup micro-LED chips to the substrate by a fluid mass transfer method, so that the backup recess in each of the sub-pixel areas where the defective pixel is detected is loaded with one of the backup micro-LED chips, wherein colors of the light emitted by the backup micro-LED chips and the main micro-LED chips in the same sub-pixel area are the same.

In some embodiments, the main recess and the backup recess in the same sub-pixel area have the same shape and size, the shape and the size of the main recess are adapted to a shape and a size of the loaded main micro-LED chip, and the shape and the size of the backup recess are adapted to a shape and a size of the loaded backup micro-LED chip.

In some embodiments, the plurality of the sub-pixel areas are divided into three areas, and each of the areas is provided with the plurality of the sub-pixel areas, wherein, the main recesses located in the same area have the same shape and size, and the main recesses located in the same area are configured to be loaded with the main micro-LED chips which emit the same color of light; and the main recesses in the different areas have the same shape but different sizes, and the main recesses located in the different areas are loaded with the main micro-LED chips which emit different colors of light.

In some embodiments, a bottom of each of the main recesses and a bottom of each of the backup recesses are provided with two electrodes, respectively, the two electrodes in the main recess are electrically connected to a first welding circuit, and the two electrodes in the backup recess are electrically connected to a second welding circuit.

In some embodiments, material of each of the electrodes is eutectic material.

In some embodiments, the step of "transferring a great number of main micro-LED chips to the substrate by a fluid mass transfer method, so that the main recess in each of the sub-pixel areas is loaded with one of the main micro-LED chips" comprises steps of:

filling all of the main recesses and all of the backup recesses with positive photoresists;

providing a first photomask, wherein the first photomask is provided with a plurality of first through holes, the plurality of first through holes are respectively provided corresponding to all of the main recesses, and a shape and a size of each of the first through holes are adapted to a cross-sectional shape and a cross-sectional size of the corresponding main recess;

covering a side of the substrate provided with the main recess using the first photomask;

performing exposure and development on the positive photoresists in all of the main recesses to remove the positive photoresists in all of the main recesses;

removing the first photomask; and providing a main suspension containing the great number of the main micro-LED chips so that the main suspension flows through the side of the substrate provided with the main recess, so that each of the main recesses is loaded with one of the main micro-LED chips.

In some embodiments, before the step of "transferring a plurality of backup micro-LED chips to the substrate by a fluid mass transfer method, so that the backup recess in each of the sub-pixel areas where the defective pixel is detected is loaded with one of the backup micro-LED chips", the repairing method further comprises a step of:

marking the backup recess in each of the sub-pixel areas where the defective pixel is detected as a repair recess.

In some embodiments, the step of "transferring a plurality of backup micro-LED chips to the substrate by a fluid mass transfer method, so that the backup recess in each of the sub-pixel areas where the defective pixel is detected is loaded with one of the backup micro-LED chips" includes steps of:

providing a second photomask, wherein the second photomask is provided with a plurality of second through holes, the plurality of second through holes are respectively provided corresponding to all of the backup recesses, and a shape and a size of each of the second through holes is adapted to a cross-sectional shape and a cross-sectional size of the corresponding backup recess covering a side of the substrate provided with the backup recess using the second photomask;

performing exposure and development on the positive photoresists in all of the repair recesses to remove the positive photoresists in all of the repair recesses;

removing the second photomask; and providing a backup suspension containing the plurality of the backup micro-LED chips so that the backup suspension flows through the side of the substrate provided with the backup recess, so that each of the repair recesses is loaded with one of the backup micro-LED chips.

In some embodiments, the step of "detecting all of the main micro-LED chips to find the sub-pixel area with a defective pixel" includes steps of:

energizing the first welding circuit to bond the two electrodes in each of the main recesses to the loaded main micro-LED chips; and detecting all of the main micro-LED chips based on an ultraviolet detection method or a micro-LED chip photoelectric characteristic detection method to find out the sub-pixel area with the defective pixel.

In some embodiments, after the step of "transferring a plurality of backup micro-LED chips to the substrate by a fluid mass transfer method, so that the backup recess in each of the sub-pixel areas where the defective pixel is detected is loaded with one of the backup micro-LED chips", the repairing method further comprises a step of:

energizing the second welding circuit, so that the two electrodes in the backup recess in each of the sub-pixel areas where the defective pixel is detected are bonded to the loaded backup micro-LED chips.

In the second aspect, the present application provides a repairing method for repairing micro-LED chip defective pixel, comprising steps of:

providing a substrate, wherein a plurality of sub-pixel areas are provided on the substrate, each of the sub-pixel areas is provided with two recesses, and the two recesses are respectively a main recess and a backup recess;

transferring a great number of main micro-LED chips to the substrate by a fluid mass transfer method, so that the main recess in each of the sub-pixel areas is loaded with one of the main micro-LED chips;

detecting all of the main micro-LED chips to find the sub-pixel area with a defective pixel; and transferring a plurality of backup micro-LED chips to the substrate by a fluid mass transfer method, so that the backup recess in each of the sub-pixel areas where the defective pixel is detected is loaded with one of the backup micro-LED chips, wherein colors of the light emitted by the backup micro-LED chips and the main micro-LED chips in the same sub-pixel area are the same, and the color is red, green or blue.

In some embodiments, the main recess and the backup recess in the same sub-pixel area have the same shape and size, the shape and the size of the main recess are adapted to a shape and a size of the loaded main micro-LED chip, and the shape and the size of the backup recess are adapted to a shape and a size of the loaded backup micro-LED chip.

In some embodiments, the plurality of the sub-pixel areas are divided into three areas, and each of the areas is provided with the plurality of the sub-pixel areas, wherein, the main recesses located in the same area have the same shape and size, and the main recesses located in the same area are configured to be loaded with the main micro-LED chips which emit the same color of light; and the main recesses in the different areas have the same shape but different sizes, and the main recesses located in the different areas are loaded with the main micro-LED chips which emit different colors of light.

In some embodiments, a bottom of each of the main recesses and a bottom of each of the backup recesses are provided with two electrodes, respectively, the two electrodes in the main recess are electrically connected to a first welding circuit, and the two electrodes in the backup recess are electrically connected to a second welding circuit.

In some embodiments, material of each of the electrodes is eutectic material.

In some embodiments, the step of "transferring a great number of main micro-LED chips to the substrate by a fluid mass transfer method, so that the main recess in each of the sub-pixel areas is loaded with one of the main micro-LED chips" comprises steps of:

filling all of the main recesses and all of the backup recesses with positive photoresists;

providing a first photomask, wherein the first photomask is provided with a plurality of first through holes, the plurality of first through holes are respectively provided corresponding to all of the main recesses, and a shape and a size of each of the first through holes are adapted to a cross-sectional shape and a cross-sectional size of the corresponding main recess;

covering a side of the substrate provided with the main recess using the first photomask;

performing exposure and development on the positive photoresists in all of the main recesses to remove the positive photoresists in all of the main recesses;

removing the first photomask; and providing a main suspension containing the great number of the main micro-LED chips so that the main suspension flows through the side of the substrate provided with the main recess, so that each of the main recesses is loaded with one of the main micro-LED chips.

In some embodiments, before the step of "transferring a plurality of backup micro-LED chips to the substrate by a fluid mass transfer method, so that the backup recess in each of the sub-pixel areas where the defective pixel is detected is loaded with one of the backup micro-LED chips", the repairing method further comprises a step of:

marking the backup recess in each of the sub-pixel areas where the defective pixel is detected as a repair recess.

In some embodiments, the step of "transferring a plurality of backup micro-LED chips to the substrate by a fluid mass transfer method, so that the backup recess in each of the sub-pixel areas where the defective pixel is detected is loaded with one of the backup micro-LED chips" includes steps of:

providing a second photomask, wherein the second photomask is provided with a plurality of second through holes, the plurality of second through holes are respectively provided corresponding to all of the backup recesses, and a shape and a size of each of the second through holes is adapted to a cross-sectional shape and a cross-sectional size of the corresponding backup recess covering a side of the substrate provided with the backup recess using the second photomask;

performing exposure and development on the positive photoresists in all of the repair recesses to remove the positive photoresists in all of the repair recesses;

removing the second photomask; and providing a backup suspension containing the plurality of the backup micro-LED chips so that the backup suspension flows through the side of the substrate provided with the backup recess, so that each of the repair recesses is loaded with one of the backup micro-LED chips.

In some embodiments, the step of "detecting all of the main micro-LED chips to find the sub-pixel area with a defective pixel" includes steps of:

energizing the first welding circuit to bond the two electrodes in each of the main recesses to the loaded main micro-LED chips; and detecting all of the main micro-LED chips based on an ultraviolet detection method or a micro-LED chip photoelectric characteristic detection method to find out the sub-pixel area with the defective pixel.

In some embodiments, after the step of "transferring a plurality of backup micro-LED chips to the substrate by a fluid mass transfer method, so that the backup recess in each of the sub-pixel areas where the defective pixel is detected is loaded with one of the backup micro-LED chips", the repairing method further comprises a step of:

energizing the second welding circuit, so that the two electrodes in the backup recess in each of the sub-pixel areas where the defective pixel is detected are bonded to the loaded backup micro-LED chips.

Beneficial Effect:

In the disclosure, the main recess and the backup recess are provided in each of the sub-pixel areas of the substrate, and the main recess in each of the sub-pixel areas is loaded with a main micro-LED chip using the fluid mass transfer method. When the defective pixels are detected in all of the main micro-LED chips, the fluid mass transfer method is used again to load the backup recess in each of the sub-pixel areas where the defective pixel is detected with one of the backup micro-LED chips. Since colors of the light emitted by the backup micro-LED chip and the main micro-LED chip in the same sub-pixel area are the same, for any sub-pixel area, if the main micro-LED chip in the sub-pixel area is the defective pixel, the backup micro-LED chip in the sub-pixel area can replace the main micro-LED chip to emit light normally, thereby completing the repair of defective pixels. Due to the fluid mass transfer method used in the repairing process, the repairing method of the present disclosure can be completed by merely pouring the suspension containing several backup micro-LED chips to the side of the substrate provided with the backup recess once or a few times, thereby improving the repair efficiency compared to the existing repairing methods for removing a defective pixel and placing a single pixel in a designated position.

DETAILED DESCRIPTION OF PREFERRED EMBODIMENTS

In order to make the purpose, technical solutions and effects of the present disclosure clear and definite, the present disclosure will be described in further detail below with reference to the attached drawings and examples. It should be understood that the specific embodiments described herein are merely illustrative of, instead of limiting the present disclosure.

The present disclosure provides a repairing method for micro-LED chip defective pixels. In order to illustrate the repairing method more clearly, the substrate required for the repair method is first described. The substrate may be a thin film transistor array substrate or a complementary metal oxide semiconductor driving substrate, which is not specifically limited in the embodiments of the present disclosure.

Figure 1:
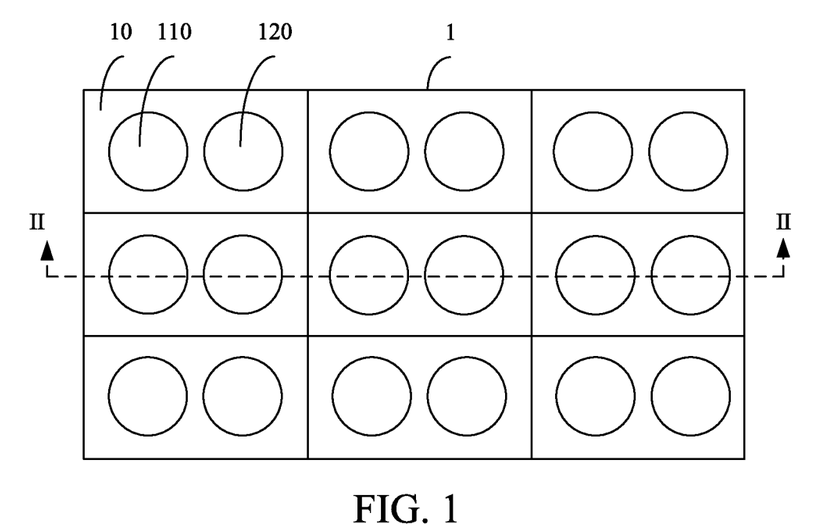
FIG. 1 is a top view of a substrate provided by an embodiment of the present disclosure.
Figure 2:
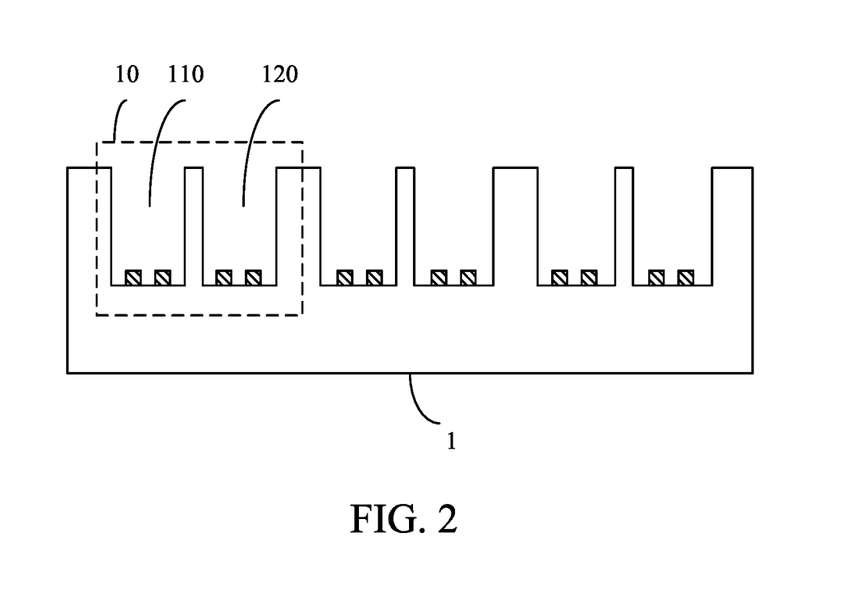
FIG. 2 is a cross-sectional view taken along the line II-II of the substrate shown in FIG. 1.

FIG. 1 is a top view of a substrate provided by an embodiment of the present disclosure, and FIG. 2 is a cross-sectional view taken along the line II-II of the substrate shown in FIG. 1. As shown in FIGS. 1 and 2, the substrate 1 is provided with a plurality of sub-pixel areas 10, wherein each of the sub-pixel areas 10 is provided with two recesses. For convenience of later description, the two recesses are referred to a main recess 110 and a backup recess 120, respectively.

The main recess 110 in each of the sub-pixel areas 10 is used to be loaded with a micro-LED chip. For convenience of later description, the micro-LED chip is referred to a main micro-LED chip.

The backup recess 120 in each of the sub-pixel areas 10 is used to be loaded with another micro-LED chip when the main micro-LED chip in the sub-pixel area 10 is a defective pixel. For convenience of later description, the another loaded micro-LED chip is referred to a backup micro-LED chip.

It should be noted that both the main micro-LED chip and the backup micro-LED chip are the components that can emit light of a specific color, where the specific color is red, green, or blue. The colors of the light emitted by the backup micro-LED chip and the main micro-LED chip in the same sub-pixel area 10 are the same. That is, both the backup micro-LED chip and the main micro-LED chip in the same sub-pixel area 10 emit red light, green light, or blue light. For any sub-pixel area 10, if the main micro-LED chip in the sub-pixel area 10 is a defective pixel, the backup micro-LED chip in the sub-pixel area 10 will replace the main micro-LED chip to emit light.

Figure 3:
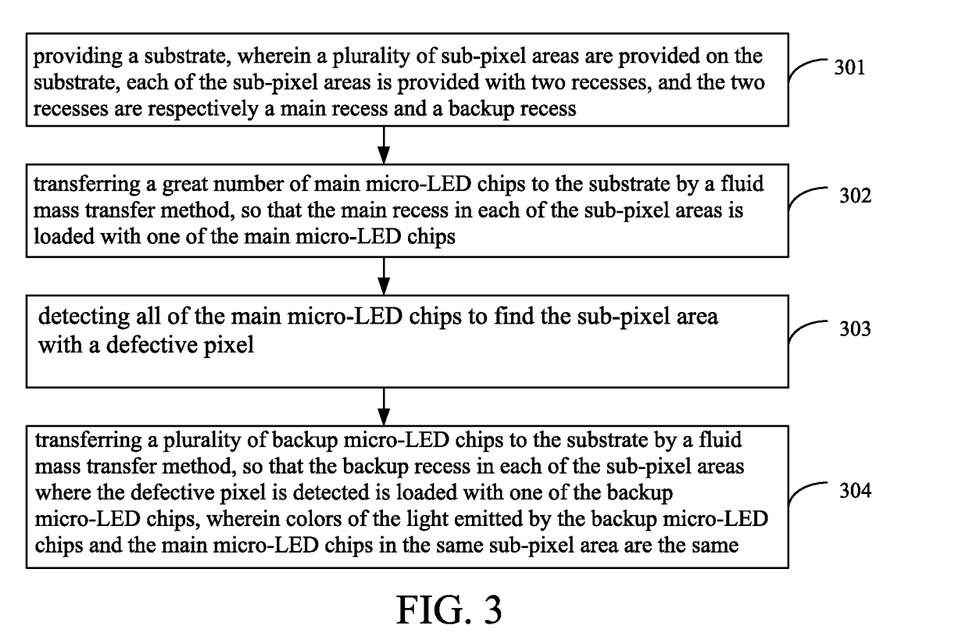
FIG. 3 is a flowchart of a repairing method for micro-LED chip defective pixels provided by an embodiment of the present disclosure.

FIG. 3 is a flowchart of a repairing method for micro-LED chip defective pixels provided by an embodiment of the present disclosure. As shown in FIG. 3, the repairing method comprises steps of:

step 301, providing a substrate 1, wherein the substrate 1 is provided with a plurality of sub-pixel areas 10, and each sub-pixel area 10 is provided with two recesses. The two recesses are respectively a main recess 110 and a backup recess 120.

Since the substrate 1 has been described in detail above, it will not be repeated here.

step 302, transferring a huge number of main micro-LED chips to the substrate 1 by a fluid mass transfer method, so that the main recess 110 in each of the sub-pixel areas 10 is loaded with one of the main micro-LED chips.

The fluid mass transfer method refers to: pouring a suspension containing the great number of main micro-LED chips to a side of the substrate 1 provided with the main recess 110, so that the suspension flows through the side of the substrate 1 with the main recess 110, so that a main micro-LED chip is fallen within each of the main recesses 110. Since each of the main recesses 110 can only be loaded with one of the main micro-LED chips, all openings of the backup recesses 120 need to be blocked. Since there are many blocking methods, the specific description for the blocking methods are omitted in the embodiment of the present disclosure.

step 303: detecting all of the main micro-LED chips to find the sub-pixel area 10 where the defective pixel is detected.

step 304: transferring a plurality of backup Micro-LED chips to the substrate 1 by a fluid mass transfer method, so that the backup recess 120 in each of the sub-pixel areas 10 where the defective pixel is detected is loaded with one of the backup micro-LED chips.

The fluid mass transfer method refers to: pouring a suspension containing the plurality of backup micro-LED chips to a side of the substrate 1 provided with the backup recess 120, so that the suspension flows through the side of the substrate 1 with the backup recess 120, so that a backup micro-LED chip is fallen within the backup recess 120 in each of the sub-pixel areas 10 where the defective pixel is detected. Since each of the backup recesses 120 in each of the sub-pixel areas 10 can only be loaded with one of the backup micro-LED chips, the openings of the backup recesses 120 that do not need to be loaded with the backup micro-LEDs are blocked. Since there are many blocking methods, the specific description for the blocking methods are omitted in the embodiment of the present disclosure.

It can be understood that the main recess 110 and the backup recess 120 are provided in each of the sub-pixel areas 10 of the substrate 1, and the main recess 110 in each of the sub-pixel areas 10 is loaded with a main micro-LED chip using the fluid mass transfer method. When the defective pixels are detected in all of the main micro-LED chips, the fluid mass transfer method is used again to load the backup recess 120 in each of the sub-pixel areas 10 where the defective pixel is detected with one of the backup micro-LED chips. Since colors of the light emitted by the backup micro-LED chip and the main micro-LED chip in the same sub-pixel area are the same, for any sub-pixel area 10, if the main micro-LED chip in the sub-pixel area 10 is the defective pixel, the backup micro-LED chip in the sub-pixel area 10 can replace the main micro-LED chip to emit light normally, thereby completing the repair of defective pixels. Due to the fluid mass transfer method used in the repairing process, the repairing method in the present disclosure can be completed by merely pouring the suspension containing several backup micro-LED chips to the side of the substrate provided with the backup recess 120 once or a few times, thereby improving the repair efficiency compared to the existing repairing methods for removing a defective pixel and placing a single pixel in a designated position.

In some embodiments, as shown in FIGS. 1 and 2, the main recess 110 and the backup recess 120 in the same sub-pixel area 10 have the same shape and size. The shapes of the main recess 110 and the backup recess 120 shown in FIG. 1 and FIG. 2 are cylindrical, and the cross-sectional shapes thereof are circular. In other embodiments, the shapes of the main recess 110 and the backup recess 120 may be other shapes, which are not specifically limited in the embodiments of the present disclosure.

The main recess 110 is adapted to a shape and a size of the main micro-LED chip loaded thereon. That is, the main recess 110 may be substantially filled with the main micro-LED chip, and the remaining space of the main recess 110 loaded with one main micro-LED chip cannot be loaded with other main micro-LED chips or backup micro-LED chips.

The backup recess 120 is adapted to a shape and a size of the backup micro-LED chip loaded thereon. That is, the backup recess 120 may be substantially filled with the backup micro-LED chip, and the remaining space of the backup recess 120 loaded with one backup micro-LED chip cannot be loaded with other backup micro-LED chips.

Figure 4:
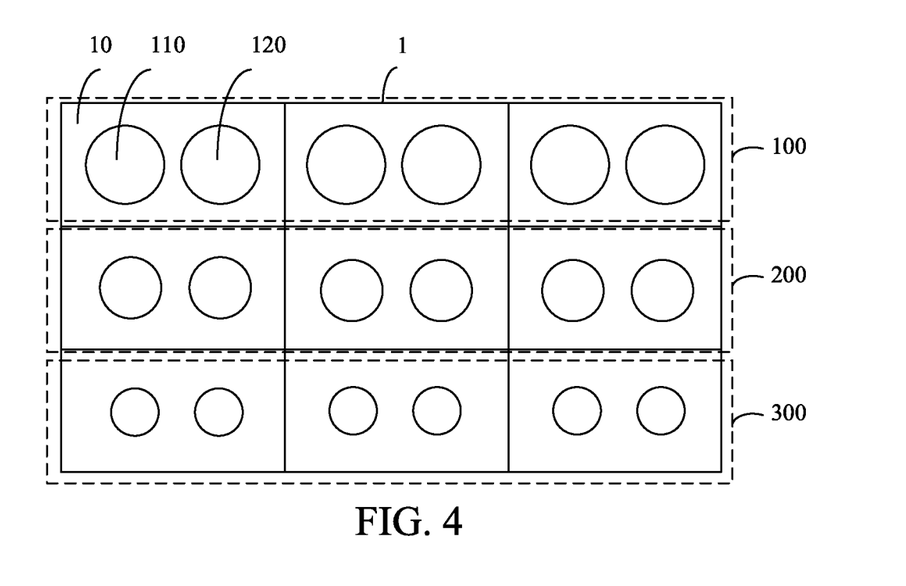
FIG. 4 is a top view of a substrate provided by another embodiment of the present disclosure.

In some embodiments, as shown in FIG. 4, several sub-pixel areas 10 are divided into three areas, which are referred to a first area 100, a second area 200, and a third area 300. There are a plurality of sub-pixel areas 10 in each area.

The main recesses 110 located in the same area have the same shape and size, and the main recesses 110 located in the same area are used to be loaded with the main micro-LED chips emitting the light of the same color.

Since the main recess 110 and the backup recess 120 in the same sub-pixel area 10 have the same shape and size, the main recess 110 and the backup recess 120 in the same area have the same shape and size. Since colors of light emitted by the backup micro-LED chip and the main micro-LED chip in the same sub-pixel area 10 are the same, the colors of light emitted by the backup micro-LED chip and the main micro-LED chip in the same area are the same.

The main recesses in the different areas have the same shape but different sizes, and the main recesses in the different areas are loaded with the main micro-LED chips that emit different colors of light.

As shown in FIG. 4, in the embodiment of the present disclosure, all the cross-sectional shapes of the main recesses 110 and the backup recesses 120 in the three areas are circular. However, a size of the main recess 110 in the first area 100 is larger than a size of the main recess 110 in the second area 200, and the size of the main recess 110 in the second area 200 is larger than a size of the main recess 110 in the third area 300.

Moreover, the main recess 110 in the first area 100 is loaded with the main micro-LED chip emitting red light, the main recess 110 in the second area 200 is loaded with the main micro-LED chip emitting green light, and the main recess 110 in the third area 300 is loaded with the main micro-LED chip emitting blue light.

Figure 5:
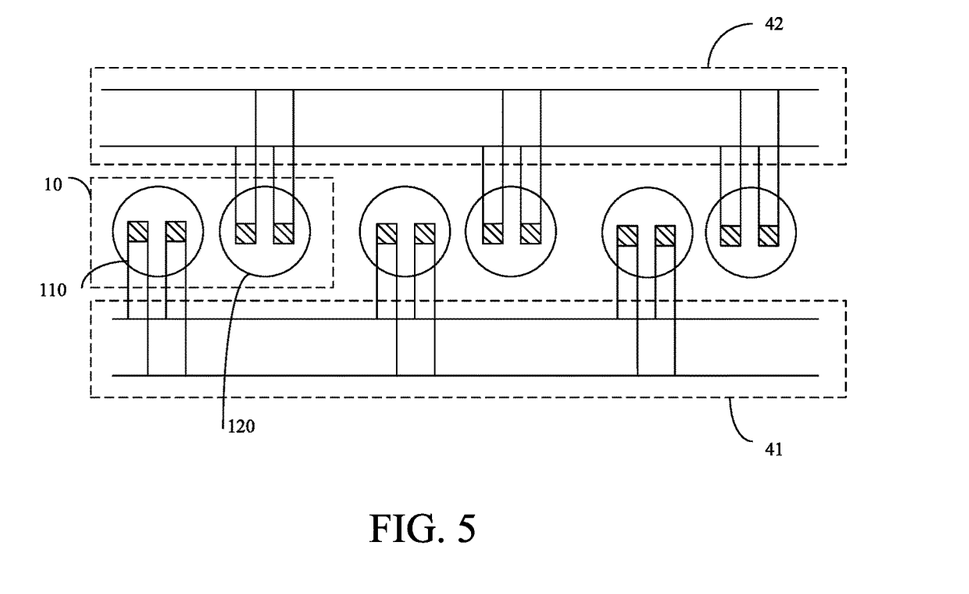
FIG. 5 is a schematic diagram of a connection between an electrode and a welding circuit provided by an embodiment of the present disclosure.

In some embodiments, two electrodes are provided on the bottoms of each of the main recesses 110 and each of the backup recesses 120. Each hatched frame shown in FIG. 2 represents one electrode. As shown in FIG. 5, the two electrodes in each of the main recesses 110 are electrically connected to a first welding circuit 41, and the two electrodes in each of the backup recesses 120 are electrically connected to a second welding circuit 42.

The first welding circuit 41 is used to bond the two electrodes in each of the main recesses 110 to the main micro-LED chip loaded therein respectively after the first welding circuit 41 is energized, so that each of the main micro-LED chips is electrically connected to the substrate 1.

Similarly, the second welding circuit 42 is used to bond the two electrodes in each of the backup recesses 110 to each of the backup micro-LED chips loaded therein after the second welding circuit is energized, so that each of the backup micro-LED chips is electrically connected to the substrate 1.

In some embodiments, material of each electrode is eutectic material. The eutectic material is the material with a low melting point. When the first welding circuit 41 is energized, the two electrodes in each of the main recesses 110 can be melted in a short time to achieve bonding with the loaded main micro-LED chip. When the second welding circuit 42 is energized, the two electrodes in each of the backup recesses 120 loaded with the backup micro-LED chip can be melted in a short time to achieve bonding with the loaded backup micro-LED chip.

Figure 6:
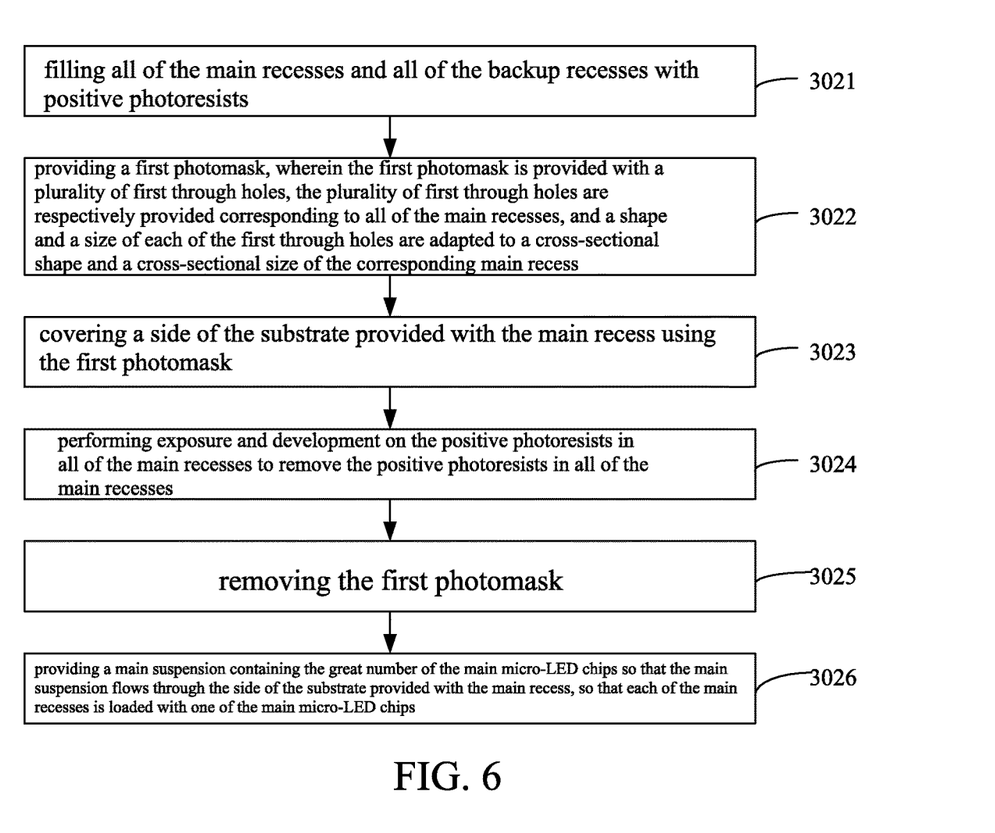
FIG. 6 is a flowchart of transferring a great number of main micro-LED chips to a substrate.

In some embodiments, as shown in FIG. 6, the step of "transferring a great number of main micro-LED chips to the substrate 1 by a fluid mass transfer method, so that the main recess 110 in each of the sub-pixel areas 10 is loaded with one of the main micro-LED chips" comprises the following steps of:

step 3021: filling all of the main recesses 110 and all of the backup recesses 120 with positive photoresists.

Figure 7:
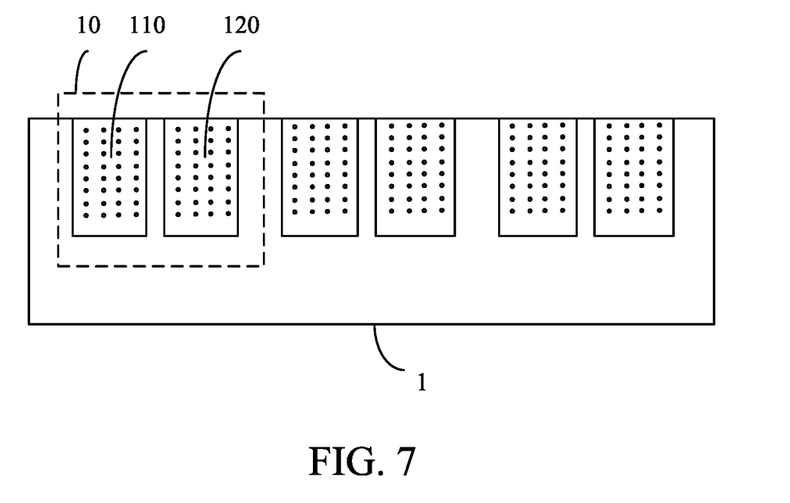
FIG. 7 is a schematic diagram of the main recesses and the backup recesses filled with positive photoresists provided by an embodiment of the present disclosure.
Figure 8:
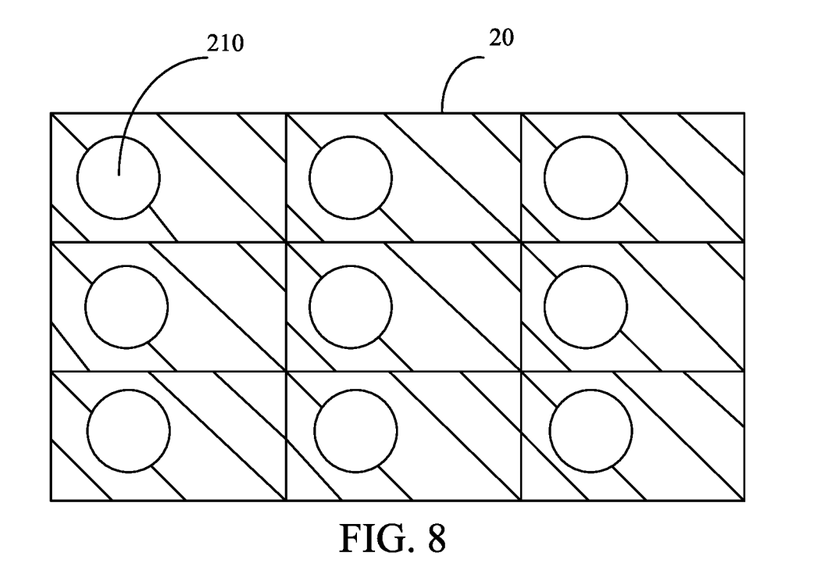
FIG. 8 is a schematic diagram of a first photomask provided by an embodiment of the present disclosure.

The positive photoresist is a kind of photosensitive material. The portion with the positive photoresist exposed to light will be melted in the developer. In the embodiment of the present disclosure, as shown in FIG. 7, all of the main recesses 110 and all of the backup recesses 120 in the substrate 1 are filled with positive photoresists (dotted areas), which meet the planarization requirement, so as to facilitate the subsequent suspension flow thereon.

step 3022: providing a first photomask 20. As shown in FIG. 8, the first photomask 20 is provided with a plurality of first through holes 210 (circular blank areas). The first through holes 210 are respectively arranged corresponding to all of the main recesses 110 in the substrate 1 shown in FIG. 1, and a shape and a size of each of the first through holes 210 are adapted to a cross-sectional shape and a cross-sectional size of the corresponding main recess 110. That is, if the first photomask 20 covers the side of the substrate 1 where the main recess 110 is provided, all of the main recesses 110 in the substrate 1 will not be blocked while all of the backup recesses 120 will be blocked.

step 3023: covering the side of the substrate 1 where the main recess 110 is provided using the first photomask 20.

Figure 9:
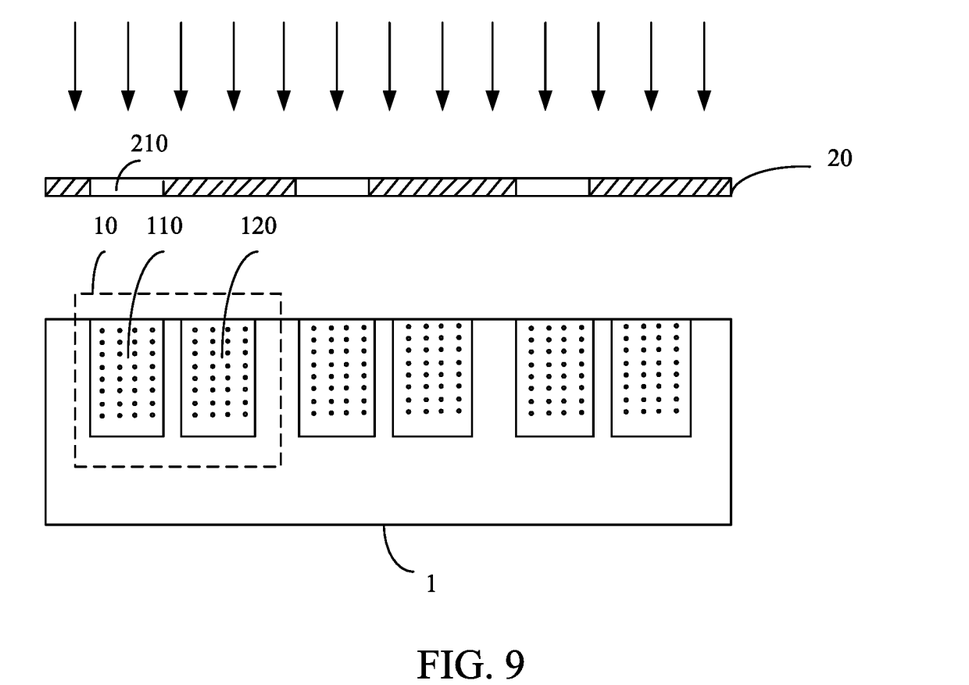
FIG. 9 is a schematic diagram of performing exposure on the positive photoresists in the main recesses.
Figure 10:
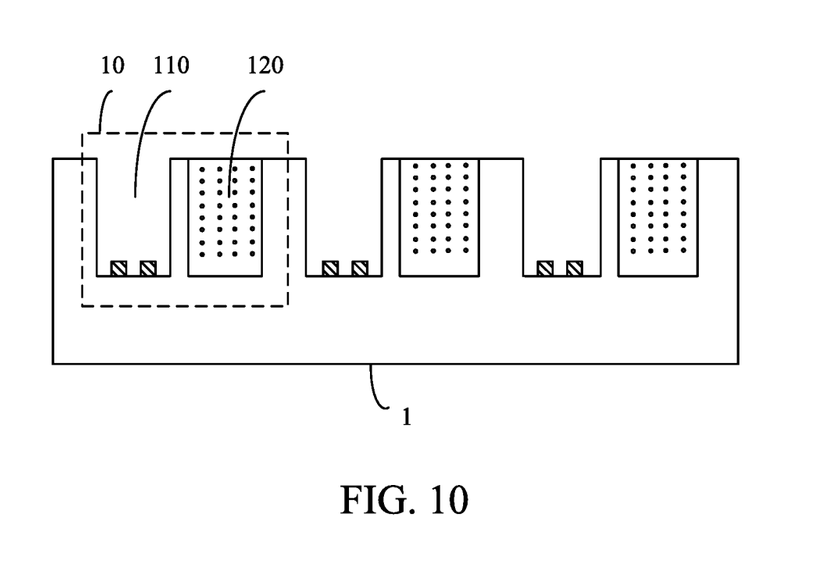
FIG. 10 is a schematic diagram of the structure of the substrate after performing exposure and development on the positive photoresists in the main recesses.
Figure 11:
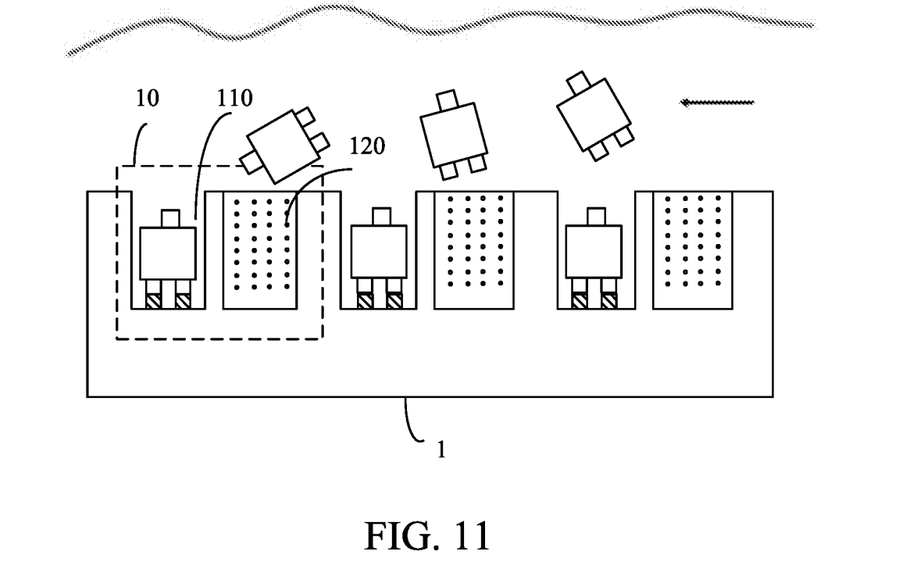
FIG. 11 is a schematic diagram of the first fluid mass transfer process.

It should be noted that when the covering is performed, it is necessary to ensure that several first through holes 210 of the first photomask 20 correspond to the positions of all of the main recesses 110 in the substrate 1, that is, to ensure that all of the main recesses 110 in the substrate 1 are not blocked, and all of the backup recesses 120 are blocked.

step 3024: as shown in FIG. 9, performing exposure on the positive photoresists in all of the main recesses 110 in the substrate 1 after the covering is completed. The multiple arrows shown in FIG. 9 represent multiple beams of light. After the exposure is completed, performing development on the positive photoresists in all of the main recesses 110 in the substrate 1 to remove the positive photoresists in all of the main recesses 110 in the substrate 1. The structure of the substrate 1 after the positive photoresists in all of the main recesses 110 are removed is shown in FIG. 10.

step 3025: removing the first photomask 20.

step 3026: as shown in FIG. 11, providing a main suspension containing a great number of main micro-LED chips, so that the main suspension flows through the side of the substrate 1 where the main recess 110 is provided, so that each of the main recesses 110 is loaded with one of the main micro-LED chips. In FIG. 11, the wavy line represents the main suspension, the arrow represents the flow direction of the main suspension, and the six irregular bodies respectively represent the six main micro-LED chips.

It should be noted that, for the substrate 1 shown in FIG. 4, all of the sub-pixel areas 10 in the substrate 1 include three areas, wherein the main recesses 110 in the same area have the same shape and size, the main micro-LED chips loaded in the main recesses 110 in the same area have the same color of emitted light, the main recesses 110 in the different areas have the same shape but different sizes, and the main micro-LED chips loaded in the main recesses 110 in the different areas have different colors of emitted light. Therefore, three types of suspensions need to be prepared for this case, a suspension containing the main micro-LED chips with the same shape, size and color, and different suspensions containing the main micro-LED chips with the same shape but different sizes and colors of emitted light.

After the preparations of the three types of suspensions are completed, the three types of suspensions are poured onto the side of the substrate 1 provided with the main recess 110 in order from the largest to the smallest of the included main micro-LED chips, so as to complete the fluid mass transfer process of the main micro-LED chips.

In some embodiments, before the step of "transferring a plurality of backup micro-LED chips to the substrate 1 by a fluid mass transfer method, so that the backup recess 120 in each of the sub-pixel areas 10 where the defective pixel is detected is loaded with one of the backup micro-LED chips", the repairing method further comprises a step of:

marking the backup recess 120 in each of the sub-pixel areas 10 where the defective pixel is detected as a repair recess.

Figure 12:
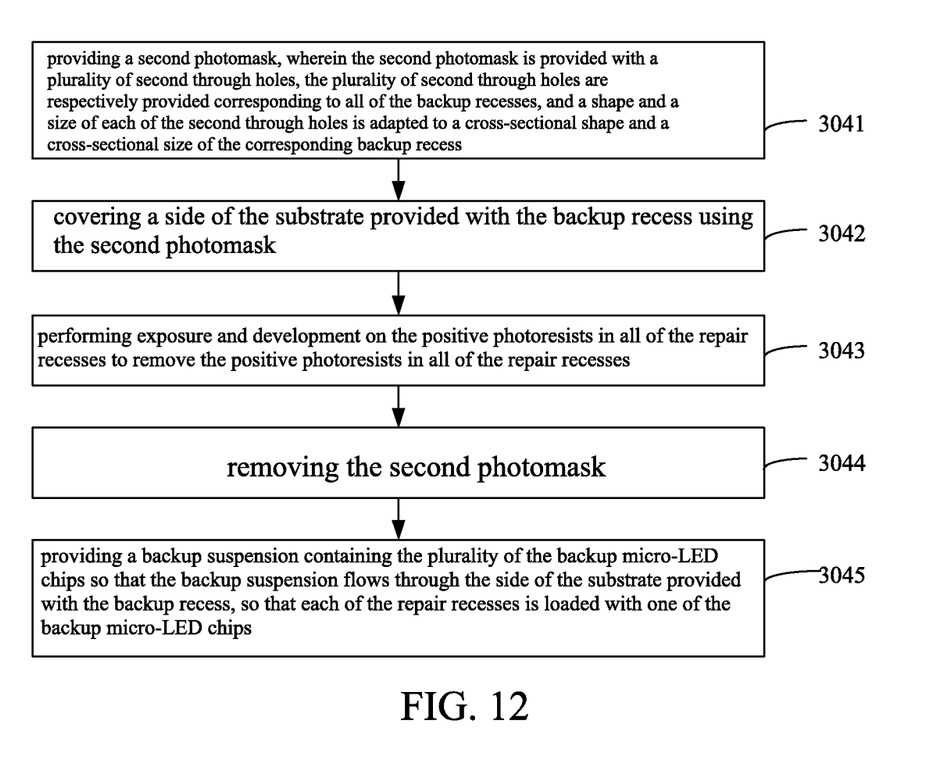
FIG. 12 is a flowchart of the transfer of several backup micro-LED chips to the substrate.
Figure 13:
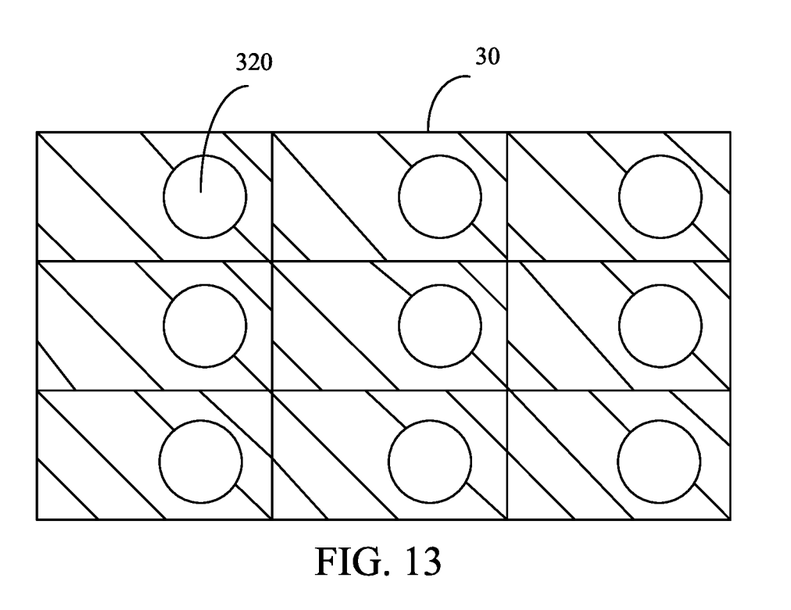
FIG. 13 is a schematic diagram of a second photomask provided by an embodiment of the present disclosure.

In some embodiments, as shown in FIG. 12, the step of "transferring a plurality of backup micro-LED chips to the substrate 1 by a fluid mass transfer method, so that the backup recess 120 in each of the sub-pixel areas 10 where the defective pixel is detected is loaded with one of the backup micro-LED chips" includes steps of:

step 3041: providing a second photomask 30. As shown in FIG. 13, the second photomask 30 is provided with a plurality of second through holes 320 (circular blank areas). The second through holes 320 are respectively provided corresponding to all of the backup recesses 120 in the substrate 1 shown in FIG. 1. Moreover, a shape and a size of each of the second through holes 320 are adapted to a cross-sectional shape and a cross-sectional size of the corresponding backup recess 120. That is, if the second photomask 30 covers the side of the substrate 1 where the backup recess 120 is provided, all of the backup recesses 120 in the substrate 1 will not be blocked while all of the main recesses 110 will be blocked.

step 3042: covering a side of the substrate 1 provided with the backup recess 120 using the second photomask 30.

Figure 14:
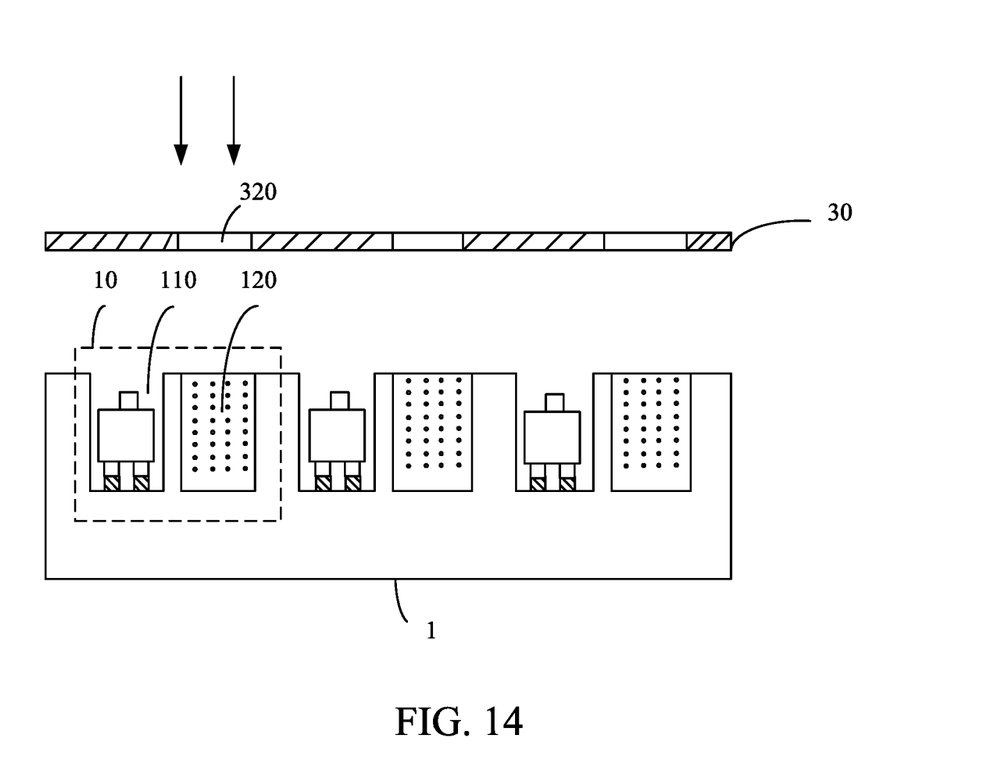
FIG. 14 is a schematic diagram of performing exposure on the positive photoresists in the repair recesses.
Figure 15:
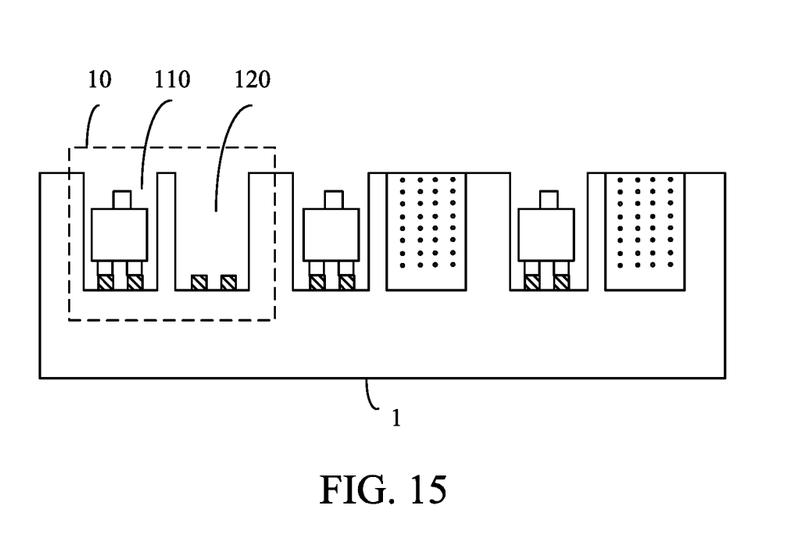
FIG. 15 is a schematic structural diagram of the substrate after performing exposure and development on the positive photoresists in the repair recesses.
Figure 16:
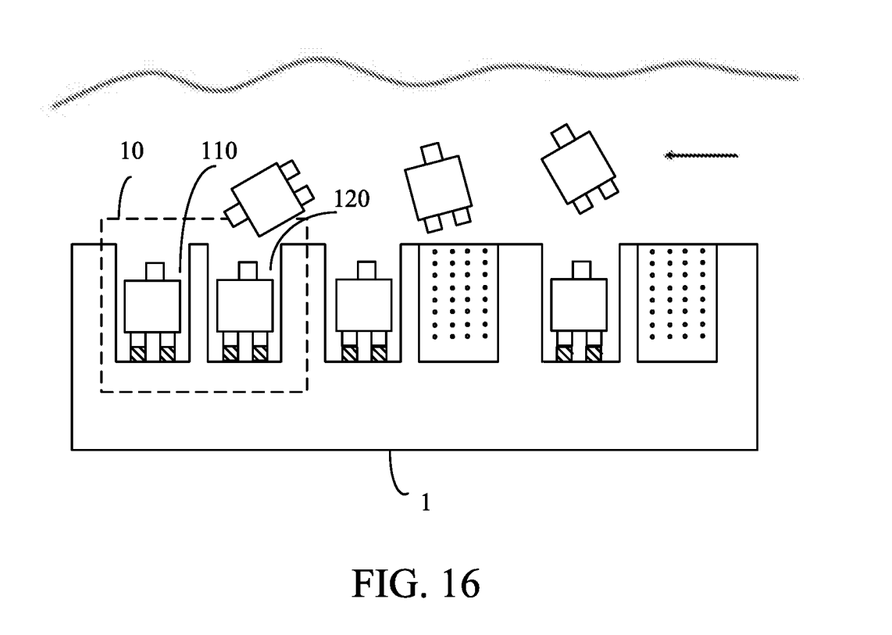
FIG. 16 is a schematic diagram of the second fluid mass transfer process.

It should be noted that when the covering is performed, it is necessary to ensure that several second through holes 320 of the second photomask 30 correspond to the positions of all of the backup recesses 120 in the substrate 1, that is, to ensure that all of the backup recesses 110 in the substrate 1 are not blocked, and all of the main recesses 120 are blocked.

step 3043: as shown in FIG. 14, performing exposure on the positive photoresists in all of the repair recesses after the covering is completed. The multiple arrows shown in FIG. 14 represent a single beam of light. After the exposure is completed, performing development on the positive photoresists in all of the repair recesses in the substrate 1 to remove the positive photoresists in all of the repair recesses in the substrate 1. The structure of the substrate 1 after the positive photoresists in all of the repair recesses are removed is shown in FIG. 15.

step 3044: removing the second photomask 30.

step 3045: as shown in FIG. 16, providing a backup suspension containing a plurality of backup micro-LED chips, so that the backup suspension flows through the side of the substrate 1 provided with the backup recess 120, so that each of the repair recesses is loaded with a backup micro-LED chip. In FIG. 16, the wavy line represents the backup suspension, and the arrow represents the flow of the backup suspension.

It should be noted that, for the substrate 1 shown in FIG. 4, all of the sub-pixel areas 10 in the substrate 1 include three areas, wherein the repair recesses 110 in the same area have the same shape and size, the backup micro-LED chips loaded in the repair recesses in the same area have the same color of emitted light, the repair recesses in the different areas have the same shape but different sizes, and the backup micro-LED chips loaded in the repair recesses in the different areas have different colors of emitted light. Therefore, three types of suspensions need to be prepared for this case, including a suspension containing the backup micro-LED chips with the same shape, size and color, and different suspensions containing the backup micro-LED chips with the same shape but different sizes and colors of emitted light.

After the preparations of the three types of suspensions are completed, the three types of suspensions are poured onto the side of the substrate 1 provided with the backup recess 120 in order from the largest to the smallest of the included backup micro-LED chips, so as to complete the fluid mass transfer process of the backup micro-LED chips.

In some embodiments, the step "detecting all of the main micro-LED chips to find the sub-pixel area 10 with a defective pixel" includes the following steps:

energizing the first welded circuit 41 to bond the two electrodes in each of the main recesses 110 to the loaded main micro-LED chips; and detecting all of the main micro-LED chips based on an ultraviolet detection method or a micro-LED chip photoelectric characteristic detection method to find out the sub-pixel area 10 with the defective pixel.

It should be noted that, after the two electrodes in the main recess 110 are bonded to the main micro-LED chip, a thermal annealing method may be used to improve the stress relationship between the two electrodes and the main micro-LED chip, thereby improving the bonding performance between the two electrodes and the main micro-LED chip.

In some embodiments, after the step of "transferring a plurality of backup micro-LED chips to the substrate 1 by a fluid mass transfer method, so that the backup recess 120 in each of the sub-pixel areas 10 where the defective pixel is detected is loaded with one of the backup micro-LED chips", the repairing method further comprises a step of:

energizing the second welded circuit 42, so that the two electrodes in the backup recess 120 in each of the sub-pixel areas 10 where the defective pixel is detected are bonded to the loaded backup micro-LED chips.

It should be noted that, after the two electrodes in the backup recess 110 are bonded to the backup micro-LED chip, a thermal annealing method may be used to improve the stress relationship between the two electrodes and the backup micro-LED chip, thereby improving the bonding performance between the two electrodes and the backup micro-LED chip.

In summary, the repairing method provided by the embodiments of the present disclosure, which conveniently repairs the micro-LED defective pixels by using the fluid transfer environment and transfer characteristics, has the characteristics of simple process, high repair efficiency, and low costs, and thus is conducive to improving the yield of micro-LED display production.

It can be understood that for those of ordinary skill in the art, equivalent replacements or changes can be made according to the technical solutions and inventive concepts of the present disclosure, and all such changes or replacements should fall within the protection scope of the claims appended to the present disclosure.

What is claimed is:

1. A repairing method for repairing micro-LED chip defective pixel, comprising steps of:

providing a substrate, wherein a plurality of sub-pixel areas are provided on the substrate, each of the sub-pixel areas is provided with two recesses, and the two recesses are respectively a main recess and a backup recess;

transferring a plurality of main micro-LED chips to the substrate by a fluid mass transfer method, so that the main recess in each of the sub-pixel areas is loaded with one of the main micro-LED chips;

detecting all of the main micro-LED chips to find the sub-pixel area with a defective pixel; and transferring a plurality of backup micro-LED chips to the substrate by a fluid mass transfer method, so that the backup recess in each of the sub-pixel areas where the defective pixel is detected is loaded with one of the backup micro-LED chips, wherein colors of the light emitted by the backup micro-LED chips and the main Micro-LED chips in the same sub-pixel area are the same, and the color is red, green or blue; wherein a bottom of each of the main recesses and a bottom of each of the backup recesses are provided with two electrodes, respectively, the two electrodes in the main recess are electrically connected to a first welding circuit, and the two electrodes in the backup recess are electrically connected to a second welding circuit; wherein the step of "detecting all of the main micro-LED chips to find the sub-pixel area with a defective pixel" includes steps of:

energizing the first welding circuit to bond the two electrodes in each of the main recesses to the loaded main micro-LED chips; and detecting all of the main micro-LED chips based on an ultraviolet detection method or a micro-LED chip photoelectric characteristic detection method to find out the sub-pixel area with the defective pixel; wherein after the step of "transferring a plurality of backup micro-LED chips to the substrate by a fluid mass transfer method, so that the backup recess in each of the sub-pixel areas where the defective pixel is detected is loaded with one of the backup micro-LED chips", the repairing method further comprises a step of:

energizing the second welding circuit, so that the two electrodes in the backup recess in each of the sub-pixel areas where the defective pixel is detected are bonded to the loaded backup micro-LED chips.

2. The repairing method of claim 1, wherein the main recess and the backup recess in the same sub-pixel area have the same shape and size, the shape and the size of the main recess are adapted to a shape and a size of the loaded main micro-LED chip, and the shape and the size of the backup recess are adapted to a shape and a size of the loaded backup micro-LED chip.

3. The repairing method of claim 2, wherein the plurality of the sub-pixel areas are divided into three areas, and each of the areas is provided with the plurality of the sub-pixel areas, wherein, the main recesses located in the same area have the same shape and size, and the main recesses located in the same area are configured to be loaded with the main micro-LED chips which emit the same color of light; and the main recesses in the different areas have the same shape but different sizes, and the main recesses located in the different areas are loaded with the main micro-LED chips which emit different colors of light.

4. The repairing method of claim 1, wherein material of each of the electrodes is eutectic material.

5. The repairing method of claim 1, wherein the step of "transferring a plurality of main micro-LED chips to the substrate by a fluid mass transfer method, so that the main recess in each of the sub-pixel areas is loaded with one of the main micro-LED chips" comprises steps of: filling all of the main recesses and all of the backup recesses with positive photoresists; providing a first photomask, wherein the first photomask is provided with a plurality of first through holes, the plurality of first through holes are respectively provided corresponding to all of the main recesses, and a shape and a size of each of the first through holes are adapted to a cross-sectional shape and a cross-sectional size of the corresponding main recess; covering a side of the substrate provided with the main recess using the first photomask; performing exposure and development on the positive photoresists in all of the main recesses to remove the positive photoresists in all of the main recesses; removing the first photomask; and providing a main suspension containing the plurality of the main micro-LED chips so that the main suspension flows through the side of the substrate provided with the main recess, so that each of the main recesses is loaded with one of the main micro-LED chips.

6. The repairing method of claim 5, wherein before the step of "transferring a plurality of backup micro-LED chips to the substrate by a fluid mass transfer method, so that the backup recess in each of the sub-pixel areas where the defective pixel is detected is loaded with one of the backup micro-LED chips", the repairing method further comprises a step of: marking the backup recess in each of the sub-pixel areas where the defective pixel is detected as a repair recess.

7. The repairing method of claim 6, wherein the step of "transferring a plurality of backup micro-LED chips to the substrate by a fluid mass transfer method, so that the backup recess in each of the sub-pixel areas where the defective pixel is detected is loaded with one of the backup micro-LED chips" includes steps of: providing a second photomask, wherein the second photomask is provided with a plurality of second through holes, the plurality of second through holes are respectively provided corresponding to all of the backup recesses, and a shape and a size of each of the second through holes is adapted to a cross-sectional shape and a cross-sectional size of the corresponding backup recess; covering a side of the substrate provided with the backup recess using the second photomask; performing exposure and development on the positive photoresists in all of the repair recesses to remove the positive photoresists in all of the repair recesses; removing the second photomask; and providing a backup suspension containing the plurality of the backup micro-LED chips so that the backup suspension flows through the side of the substrate provided with the backup recess, so that each of the repair recesses is loaded with one of the backup micro-LED chips.

* * * * *